United States Patent
Saraf et al.

(10) Patent No.: US 9,305,748 B2
(45) Date of Patent: *Apr. 5, 2016

(54) METHOD OF MATCHING TWO OR MORE PLASMA REACTORS

(71) Applicant: APPLIED MATERIALS, INC., Santa Clara, CA (US)

(72) Inventors: Gaurav Saraf, Santa Clara, CA (US); Xiawan Yang, San Jose, CA (US); Farid Abooameri, Pleasanton, CA (US); Wen Teh Chang, Sunnyvale, CA (US); Anisul H. Khan, Santa Clara, CA (US); Bradley Scott Hersch, Park City, UT (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 226 days.

This patent is subject to a terminal disclaimer.

(21) Appl. No.: 14/064,890

(22) Filed: Oct. 28, 2013

(65) Prior Publication Data

US 2015/0096959 A1    Apr. 9, 2015

Related U.S. Application Data

(60) Provisional application No. 61/886,822, filed on Oct. 4, 2013.

(51) Int. Cl.
*H01L 21/302* (2006.01)
*H01J 37/32* (2006.01)

(52) U.S. Cl.
CPC ........... *H01J 37/321* (2013.01); *H01J 37/3299* (2013.01); *H01J 37/32431* (2013.01); *H01J 37/32935* (2013.01)

(58) Field of Classification Search
CPC ............... H01L 21/67253; H01L 21/67155; H01L 21/3065; H01J 37/321; H01J 37/32091; H01J 37/3299; H01J 37/32431
USPC ........ 216/41, 58, 67, 72, 61; 438/9, 706, 712, 438/714
See application file for complete search history.

(56) References Cited

U.S. PATENT DOCUMENTS 6,042,687 A    3/2000   Singh et al.
6,271,529 B1 *  8/2001  Farley et al. ............. 250/492.21
8,414,736 B2   4/2013   Collins et al.

(Continued)

FOREIGN PATENT DOCUMENTS

JP      2003234293 A    8/2003
WO     WO-2006/041634 A2    4/2006

OTHER PUBLICATIONS

U.S. Appl. No. 14/064,914, filed Oct. 28, 2013, Saraf et al.
Giapis, Konstantinos P., et al., Microscopic and macroscopic uniformity control in plasma etching, Applied Physics Letters, Sep. 3, 1990, pp. 983-985, AIP, USA.

(Continued)

*Primary Examiner* — Lan Vinh
(74) *Attorney, Agent, or Firm* — Robert M. Wallace

(57) ABSTRACT

Etch rate distributions are captured at a succession of hardware tilt angles of the RF source power applicator relative to the workpiece and their non-uniformities computed, and the behavior is modeled as a non-uniformity function for each one of at least two plasma reactors. An offset $\Delta\alpha$ in tilt angle $\alpha$ between the non-uniformity functions of the two plasma reactors is detected. The two plasma reactors are then matched by performing a hardware tilt in one of them through a tilt angle equal to the offset $\Delta\alpha$.

13 Claims, 12 Drawing Sheets

(56) References Cited

U.S. PATENT DOCUMENTS

| | | | |
|---|---|---|---|
| 2004/0083971 | A1 | 5/2004 | Holland et al. |
| 2005/0034815 | A1 | 2/2005 | Kasai et al. |
| 2007/0256784 | A1* | 11/2007 | Chandrachood et al. ............... 156/345.24 |
| 2007/0256787 | A1 | 11/2007 | Chandrachood et al. |
| 2008/0112780 | A1* | 5/2008 | Matano et al. ............ 414/217.1 |
| 2009/0159425 | A1 | 6/2009 | Liu et al. |
| 2013/0109112 | A1 | 5/2013 | Grimbergen |
| 2013/0206594 | A1 | 8/2013 | Collins et al. |

OTHER PUBLICATIONS

Banna, Samer, et al., Inductively Coupled Pulsed Plasmas in the Presence of Synchronous Pulsed Substrate Bias for Robust, Reliable, and Fine Conductor Etching, contd . . . IEEE Transactions on Plasma Science, Sep. 2009, pp. 1730-1746, Nuclear and Plasma Sciences Society, USA.

Official Action Dated Jun. 18, 2015 Issued in Co-Pending U.S. Appl. No. 14/064,914.

* cited by examiner

METHOD OF MATCHING TWO OR MORE PLASMA REACTORS

CROSS-REFERENCE TO RELATED APPLICATION

This application claims the benefit of U.S. Provisional Application Ser. No. 61/886,822 filed Oct. 4, 2013 entitled A METHOD OF MATCHING TWO OR MORE PLASMA REACTORS, by Gaurav Saraf et al.

BACKGROUND

1. Technical Field

The disclosure concerns plasma etch processing of a workpiece such as a semiconductor wafer, in which plasma ion density distribution is controlled.

2. Background Discussion

Generally, plasma reactors or chambers of identical or similar design may produce similar process results, although there may be differences in process results among the plasma reactors. The process results are affected by plasma ion density distribution over the workpiece or wafer being processed. In cases in which a plasma etch process is performed, plasma ion density distribution is reflected by depth or etch rate distribution on wafer surface. In cases in which a plasma deposition process is performed, plasma ion density distribution is reflected by thickness or deposition rate distribution on the wafer surface. In large manufacturing facilities, a set of two or more plasma reactors of identical design may be used to perform an etch process on many workpieces. In such cases, differences in etch rate distribution among the set of plasma reactors can be problematical. Such differences may be attributable to mechanical tolerances or other factors in the assembly of the set of plasma reactors.

SUMMARY

A method of matching two plasma reactors comprises, for each one of the two plasma reactors: (a) obtaining successive process rate distributions relative to a workpiece plane at successive tilt angles between the workpiece plane and a source power applicator, and determining successive non-uniformity values of the successive process rate distributions, and (b) generating a non-uniformity function from the successive non-uniformity values and from corresponding ones of the successive tilt angles. The method further comprises determining an offset in tilt angle between the non-uniformity functions of the two plasma reactors, and changing the tilt angle in one of the two plasma reactors by an amount corresponding to the offset in tilt angle.

In one embodiment, the successive tilt angles begin at an initial tilt angle and define rotations about a predetermined tilt axis. In this embodiment, changing the tilt angle is carried out by setting the tilt angle in the one plasma reactor to an angle exceeding the initial tilt angle by an amount equal to the offset in tilt angle.

In an embodiment, the initial tilt angle is zero. In a related embodiment, the initial tilt angle with reference to a coordinate system common to the two plasma reactors is the same for both of the two plasma reactors. In a further related embodiment, an orientation of the predetermined tilt axis with respect to the common coordinate system is the same for the two plasma reactors.

In one embodiment, determining successive non-uniformity values of the successive process rate distributions is carried out by removing a radially symmetrical component from each of the process rate distributions. Each non-uniformity value is determined from each of the process rate distributions. In a related embodiment, determining successive non-uniformity values of the successive process rate distributions comprises computing a variance of each of the successive process rate distributions.

In one embodiment, each of the successive process rate distributions is a distribution of depth measurements across a workpiece.

In an embodiment, obtaining successive process rate distributions on one or more test workpieces comprises, for each successive process rate distribution: (a) performing a plasma process on a test workpiece, (b) measuring thin film depth or thin film thickness on the test workpiece at plural locations, and transforming the plural locations to a coordinate system common to the two plasma reactors. In a related embodiment, performing a plasma process is carried out using a common process recipe for the two plasma reactors.

In an embodiment, determining an offset in tilt angle between the non-uniformity functions of the two plasma reactors comprises: (a) defining a first axis for the successive non-uniformity values and a second axis for the successive tilt angles, (b) identifying a region along the second axis in which the non-uniformity functions of the two plasma reactors are linear, (c) wherein the offset in tilt angle is a distance along the second axis between locations at which the non-uniformity functions of the two plasma reactors have the same non-uniformity value along the first axis. In a related embodiment, the non-uniformity functions of the two plasma reactors have the same slope in the linear region.

One embodiment may further include selecting a third plasma reactor and matching the third plasma reactor to the other one of the pair of plasma reactors.

One embodiment is a computer readable medium containing program instructions for matching performance of two plasma reactors controlled by a computer system, wherein execution of the program instructions by the computer system causes the computer system to carry out the operations of: (A) for each one of the two plasma reactors: (1) obtaining successive process rate distributions relative to a workpiece plane at successive tilt angles between the workpiece plane and a source power applicator, and determining successive non-uniformity values of the successive process rate distributions, and (2) generating a non-uniformity function from the successive non-uniformity values and from corresponding ones of the tilt angles; (B) determining an offset in tilt angle between the non-uniformity functions of the two plasma reactors; and (C) changing the tilt angle in one of the two plasma reactors by an amount corresponding to the offset in tilt angle.

In accordance with one embodiment, a method of controlling a pair of plasma reactors in which a tilt angle between a workpiece surface and a power applicator is adjustable in each of the pair of plasma reactors, comprises: (I) in a first one of the pair of plasma reactors: (a) obtaining successive process rate distributions relative to a workpiece plane at successive tilt angles between the workpiece plane and a source power applicator, and determining successive non-uniformity values of the successive process rate distributions, and (b) generating a non-uniformity function from the successive non-uniformity values and from corresponding ones of the successive tilt angles; and (II) changing the tilt angle in one of the pair of plasma reactors, until the non-uniformity function has the same non-uniformity value at the same tilt angle as a process rate distribution of the other one of the pair of plasma reactors.

In a related embodiment, the successive tilt angles begin at an initial tilt angle and define rotations about a predetermined tilt axis. In a further embodiment, the initial tilt angle is zero. In another related embodiment, the initial tilt angle with reference to a coordinate system common to the pair of plasma reactors is the same for both of the pair of plasma reactors. In one embodiment, an orientation of the predetermined tilt axis with respect to the common coordinate system is the same for the pair of plasma reactors. In an embodiment, obtaining successive process rate distributions comprises, for each successive process rate distribution: (A) performing a plasma process on a test workpiece; and (B) measuring thin film depth or thin film thickness on the test workpiece at plural locations.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIGS. 1A, 1B and 1C are simplified diagrams, of which FIGS. 1A and 1B depict a typical one of two reactors included in a system depicted in FIG. 1C.

Figure 1A:
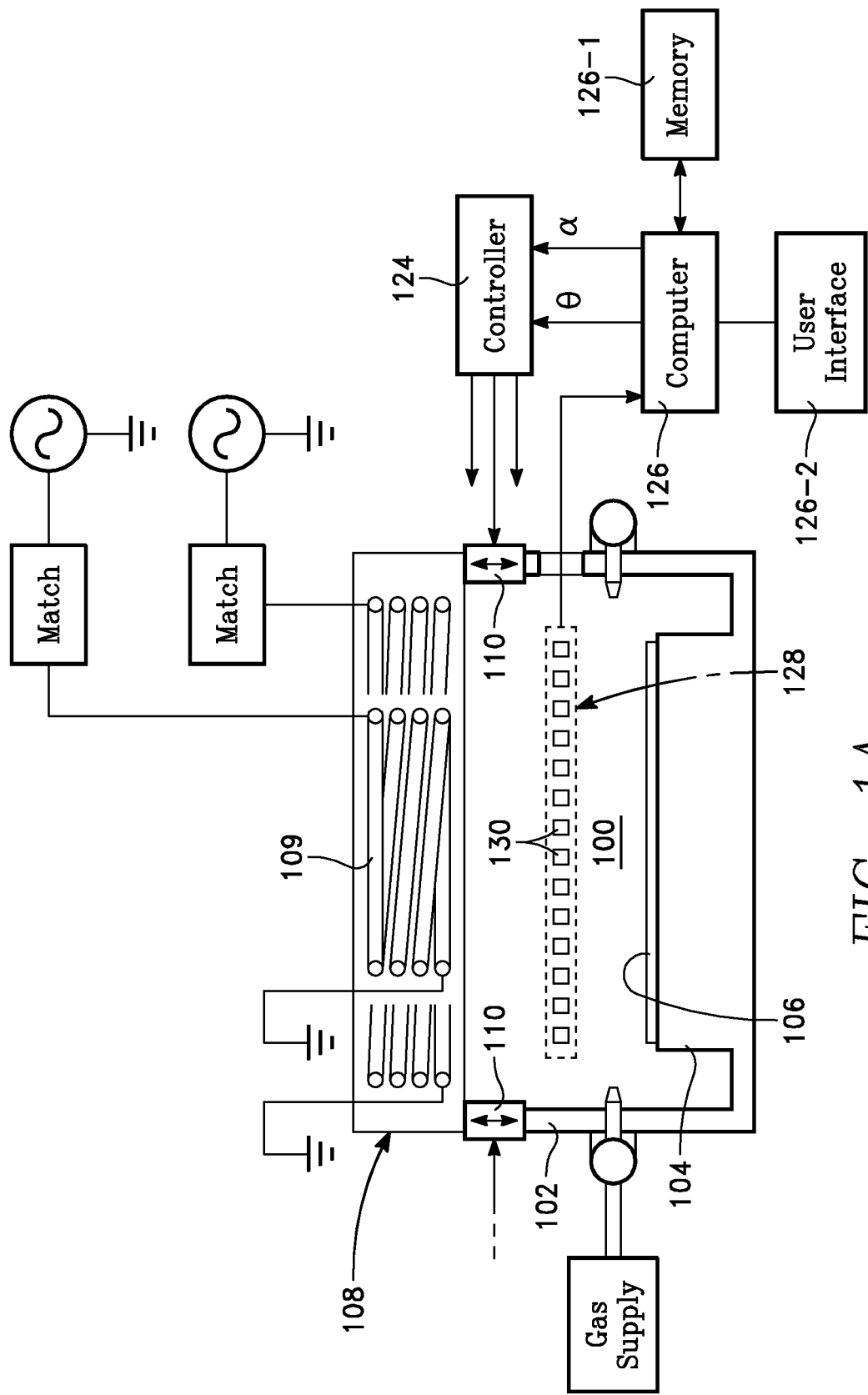

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Two plasma reactors of identical design may produce different etch rate distributions at the surface of a workpiece, such as a semiconductor wafer. The different etch rate distributions represent different plasma ion density distributions of the two plasma reactors. It is desirable to match one of the two plasma reactors to the other and obtain the same or similar etch rate distributions from the two plasma reactors.

Figure 1B:
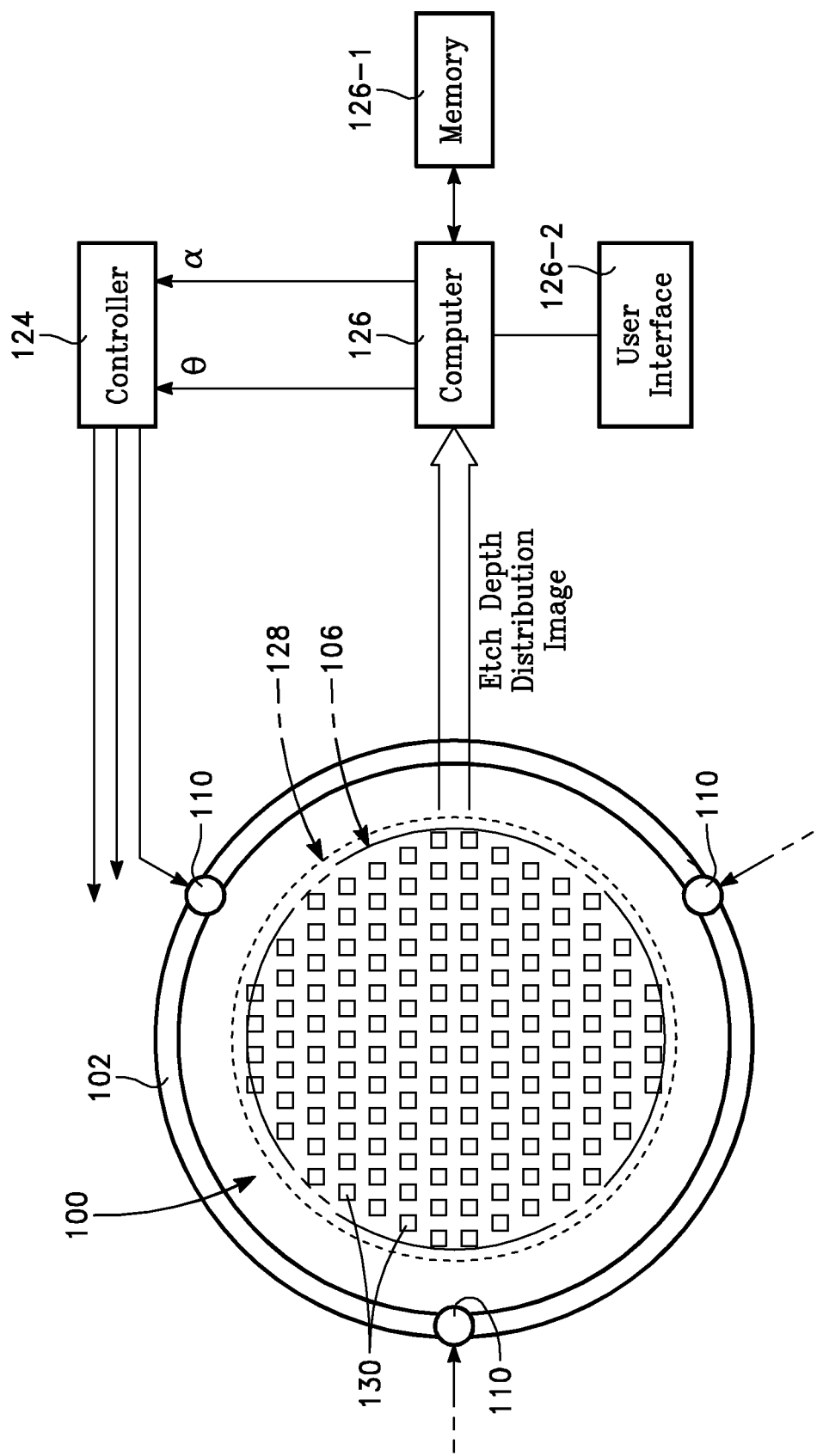
Figure 2A:
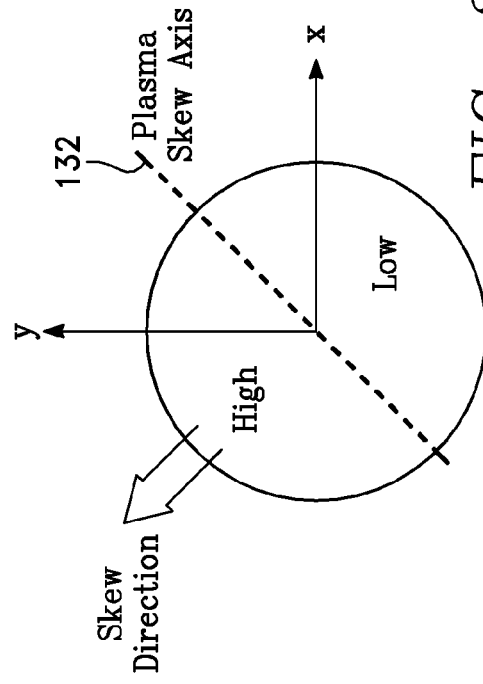
FIGS. 2A and 2B depict a coordinate system defining rotations in the reactor of FIG. 1A.
Figure 2B:
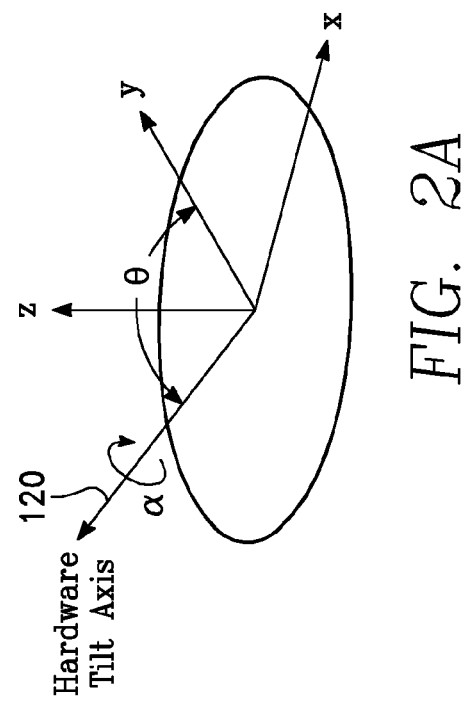

Referring to FIG. 1A, each one of the two (or more) plasma reactors or chambers to be matched has a vacuum enclosure 100 having a side wall 102, and further includes a wafer support 104 for holding a workpiece or wafer 106 having a workpiece surface, and an overhead RF power applicator support 108 underlying an RF power applicator 109. The RF power applicator support 108 may be tilted relative to the wafer support 104 or workpiece surface about any tilt axis oriented in a radial direction. In the illustrated embodiment, the wafer support 104 is fixed relative to the side wall 102. In another embodiment, the wafer support 104 may be tilted while the RF power applicator support 108 may be fixed. In the embodiment of FIG. 1A, tilting of the RF power applicator support 108 is performed by three lift actuators 110 placed at different locations around the periphery of the RF power applicator support 108, as indicated in FIG. 1B. Each lift actuator 110 may be coupled between the side wall 102 and the RF power applicator support 108. Referring to FIG. 2A, tilting of the RF power applicator support 108 may be performed as a rotation through a tilt angle $\alpha$ about a hardware tilt axis 120 lying along a tilt axis reference orientation angle $\theta$. The reference orientation angle $\theta$ defines a rotational position of the hardware tilt axis 120 about a vertical (Z) axis, while the tilt angle $\alpha$ defines a rotation about the hardware tilt axis 120 (FIG. 2B).

Referring to FIGS. 1A and 1B, a controller 124 controls each of the lift actuators 110 in accordance with commands defining desired values of $\theta$ and $\alpha$. A computer 126 generates the commanded values of $\theta$ and $\alpha$. The computer 126 may be provided with a memory 126-1 and an optional user interface 126-2. A sensor 128, which may be an array of optical depth sensors 130, may be temporarily placed above the wafer 106 after completion of an etch process in the vacuum enclosure 100, and then removed prior to commencement of further processing. Alternatively, the sensor 128 may be provided at an external location to which the wafer 106 is transferred for measurement of etch rate distribution. The sensor 128 measures thin film depth as thin film depth measurement samples at locations distributed across the surface of the wafer 106. The collection of thin film depth measurement samples and their locations is referred to as an etch rate distribution image. The sensor 128 transmits the etch rate distribution image to the computer 126. The computer 126 may compute the location of each thin film depth sample in a three-dimensional coordinate system, to produce an etch rate distribution.

Figure 3A:
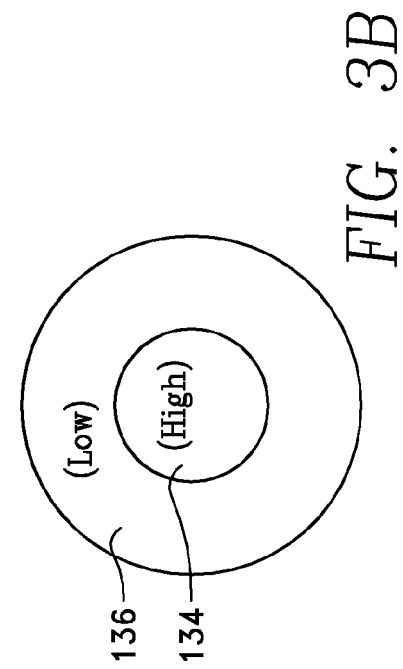
FIG. 3A depicts a plasma skew axis representative of an azimuthal skew component of non-uniformity of etch rate distribution, the skew axis being superimposed on a wafer relative to regions of high and low process rates.
Figure 3B:
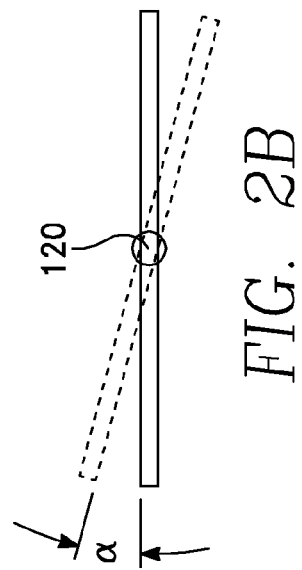
FIG. 3B is a conceptual depiction of a radially symmetrical component of non-uniformity in etch rate distribution.

The etch rate distribution may be non-uniform, and the non-uniformity may include both a radially symmetrical non-uniformity component and an azimuthal skew non-uniformity component. In the azimuthal skew non-uniformity component, the etch rate distribution is not symmetrical relative to the axis of symmetry of the wafer. For example, FIG. 3A depicts effects of the azimuthal skew non-uniformity component, in which a plasma skew axis 132 divides the wafer into a "high" etch rate region of greater thin film opening depths and a "low" etch rate region of lesser thin film opening depths. The plasma skew axis 132 may be defined by a rotation relative to axes of the coordinate system. FIG. 3B depicts one tutorial example of a radially symmetrical non-uniformity component of the etch rate distribution, in which a radially inner zone 134 of the wafer experiences a high etch rate, while a radially outer zone 136 of the wafer experiences a low etch rate. A third component (not illustrated) is a noise component of the non-uniformity of etch rate distribution.

Figure 1C:
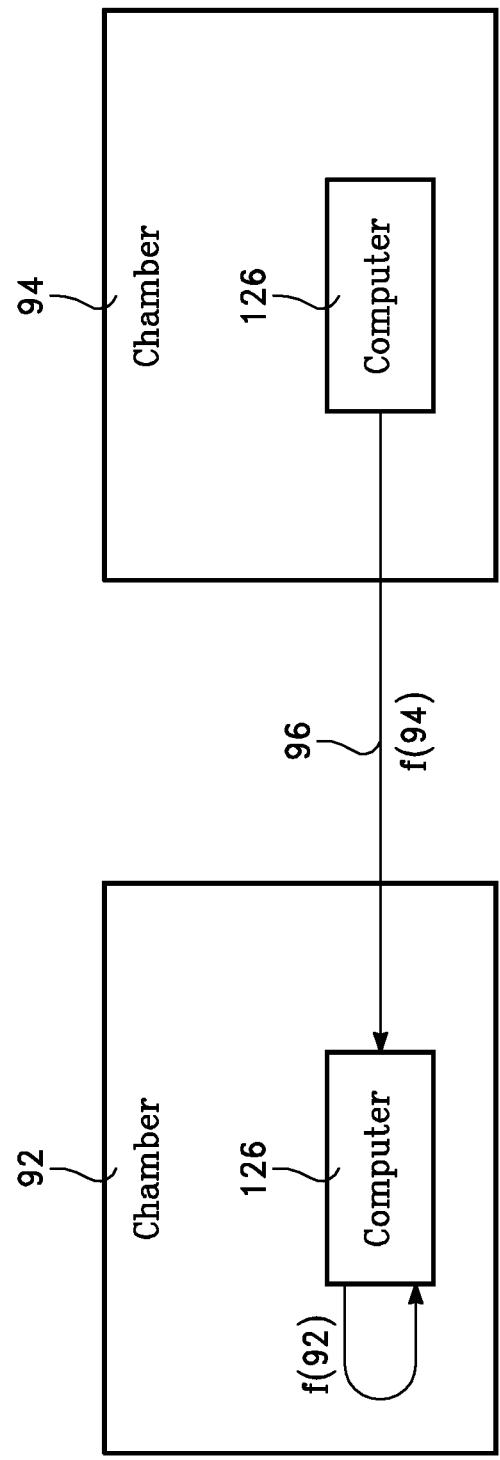

Two plasma reactors of similar design, like that of FIG. 1A for example, may be matched so as to produce at least nearly identical etch rate distributions. Referring to FIG. 1C, two reactors (chambers) 92 and 94 similar to the plasma reactor of FIG. 1A are matched so as to produce the same etch rate distribution when using the same process recipe. Each reactor 92 and 94 of FIG. 1C may have its own computer 126 of the type described in FIG. 1A. The computer 126 of each reactor 92 and 94 is programmed to deduce the behavior of etch rate distribution non-uniformity (e.g., variance $\sigma$) with change in the hardware tilt angle $\alpha$. The computers 126 of the reactors 92 and 94 may be considered as a computer system. Alternatively, such a computer system may be implemented as a single computer shared by the two reactors 92 and 94. In each reactor 92 and 94, etch rate distributions are captured at a succession of hardware tilt angles and their non-uniformities computed, and the behavior is modeled as a non-uniformity function. As indicated in FIG. 1C, the computer 126 of the first reactor 92 generates the non-uniformity function f(92) of the reactor 92 and receives the non-uniformity function f(94) of the other reactor 94 via a communication link 96.

The computer 126 of the first reactor 92 detects an offset $\Delta\alpha$ in tilt angle $\alpha$ between the non-uniformity functions of the two reactors. The two reactors are then matched by performing a hardware tilt in one of them through a tilt angle equal to the offset $\Delta\alpha$. The computer 126 of each reactor 92 and 94 is programmed to carry out the foregoing by performing the operation sequences described below with reference to FIG. 6A et seq. and/or FIG. 12A et seq. Such a procedure may be repeated with a third plasma reactor, in which case two or three or more plasma reactors may be matched to a selected plasma reactor.

Two embodiments for performing such matching are disclosed herein, namely an empirical method and a predictive method.

Figure 4:
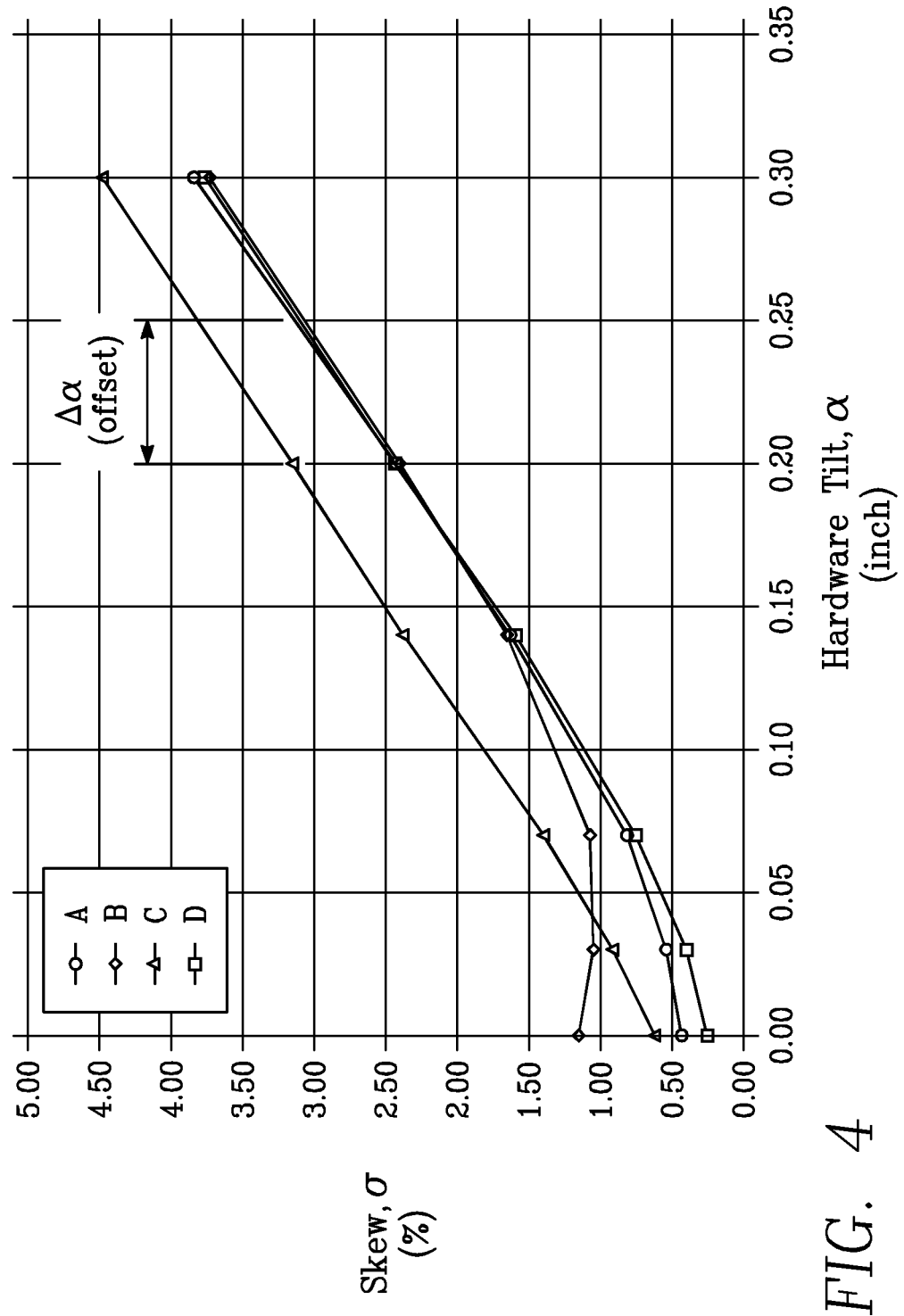
FIG. 4 is a graph of etch rate distribution non-uniformity or variance (vertical axis) as a function of hardware tilt angle for four different plasma reactors obtained in accordance with an empirical method in a first embodiment.

Empirical Method of Matching Reactors:

Such matching is performed in accordance with an empirical method by first selecting a tilt axis orientation angle $\theta$ for both reactors. For each reactor (chamber), the hardware tilt angle $\alpha$ is increased from zero in successive increments. At each increment, an etch rate distribution is captured. The variance $\sigma$ of the etch rate distribution is computed and stored with the corresponding value of $\alpha$ as a pair ($\sigma$, $\alpha$). After a predetermined number of successive increments, the resulting pairs ($\sigma$, $\alpha$) are combined to form a function $\sigma(\alpha)$ depicted in the graph of FIG. 4. The graph of FIG. 4 depicts different functions $\sigma(\alpha)$ for four different reactors, labeled A, B, C and D. In FIG. 4, for each function, $\sigma$ is plotted on the vertical axis while $\alpha$ is plotted on the horizontal axis. The tilt angle $\alpha$ is given in the graph of FIG. 4 as a height difference along the vertical or Z axis. As shown in FIG. 4, the functions $\sigma(\alpha)$ of the different reactors are dissimilar and non-linear in a lower range from $\alpha=0$ up to $\alpha=0.15$. In an upper range above $\alpha=0.15$, the functions $\sigma(\alpha)$ of the different reactors are linear and of the same slope and differ only in being offset from one another along the horizontal axis by a constant offset in $\alpha$. This offset may be referred to as a difference in $\alpha$, which may be denoted as $\Delta\alpha$. For example, the offset $\Delta\alpha$ between the functions of reactors B and C is approximately 0.05. One reactor is matched to the other by performing a hardware tilt of $\Delta\alpha$ in the one reactor relative to an initial (e.g., untilted) orientation. This tilt is a rotation about the hardware tilt axis 120 carried out while the hardware tilt axis 120 is oriented at the selected orientation angle $\theta$.

The non-linearity in the lower range (below $\alpha=0.15$) of each function $\sigma(\alpha)$ in the graph of FIG. 4 is attributable to the combination of (a) the plasma azimuthal skew non-uniformity about one axis and (b) the non-uniformity attributable to the hardware tilting about another axis (e.g., the hardware tilt axis). The high degree of linearity in the upper range (above $\alpha=0.15$) of each function $\sigma(\alpha)$ in the graph of FIG. 4 is attributable to the fact that in the upper range the non-uniformity due to hardware tilting is many times greater than the plasma azimuthal skew non-uniformity, in which case non-uniformity due to hardware tilt is observable, while effects due to plasma azimuthal skew are masked or overwhelmed.

Figure 5:
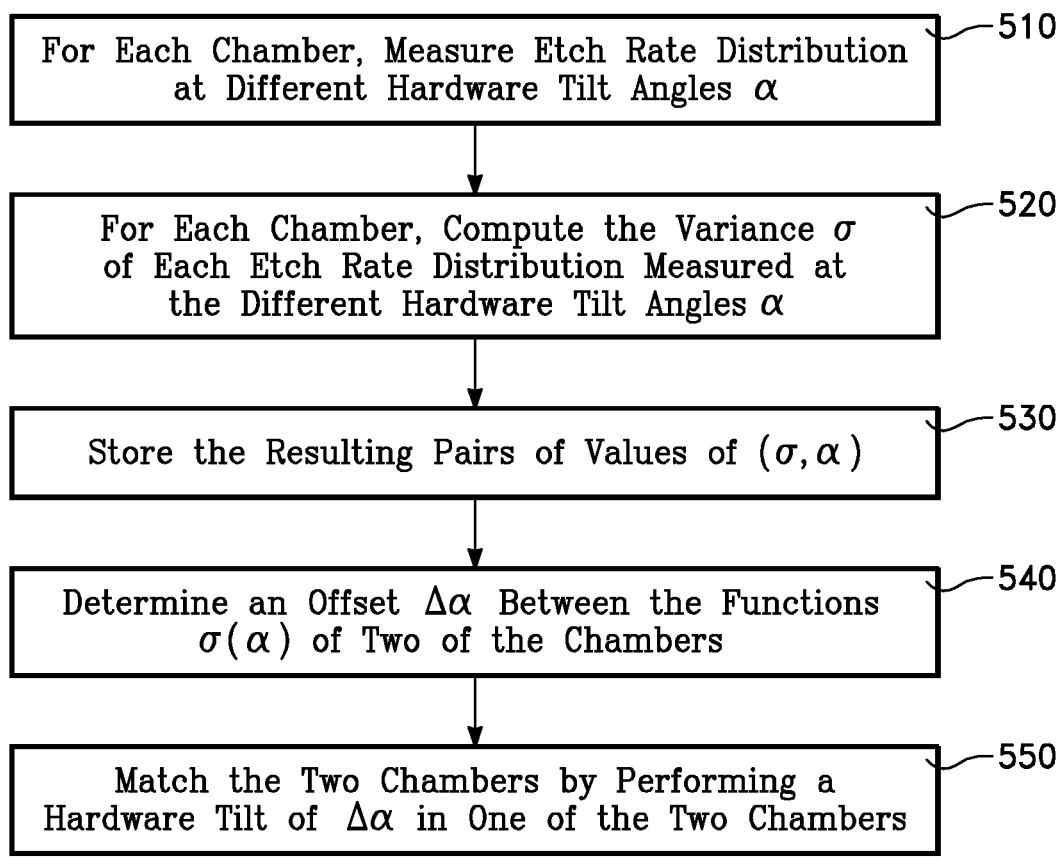
FIG. 5 is an abbreviated flow diagram providing a summary of an empirical method in accordance with a first embodiment.

FIG. 5 is an abbreviated overview of the empirical method of matching reactors discussed above. The method of FIG. 5 proceeds as follows: For each reactor, etch rate distribution are measured at successive hardware tilt angles $\alpha$ using the sensor 128 (block 510 of FIG. 5). As will be described later, the radially symmetrical component of non-uniformity may be removed from the etch rate distribution at this point. For each reactor, the computer 126 computes the variance $\sigma$ of each etch rate distribution measured at one of a succession of hardware tilt angles $\alpha$ (block 520 of FIG. 5). The resulting pairs of values of ($\sigma$, $\alpha$) are stored in the memory 126-1 (block 530 of FIG. 5). For each reactor, the computer 126 constructs a function $\sigma(\alpha)$ from the pairs of values ($\sigma$, $\alpha$) (block 540 of FIG. 5). Several examples of, the function $\sigma(\alpha)$ are depicted in the graph of FIG. 4 for different reactors. The computer 126 (or a user) performs a comparison to determine an offset $\Delta\alpha$ between the functions $\sigma(\alpha)$ of two of the reactors. The two reactors are then matched by performing a hardware tilt of $\Delta\alpha$ in one of the two reactors (block 550 of FIG. 5).

Figure 6A:
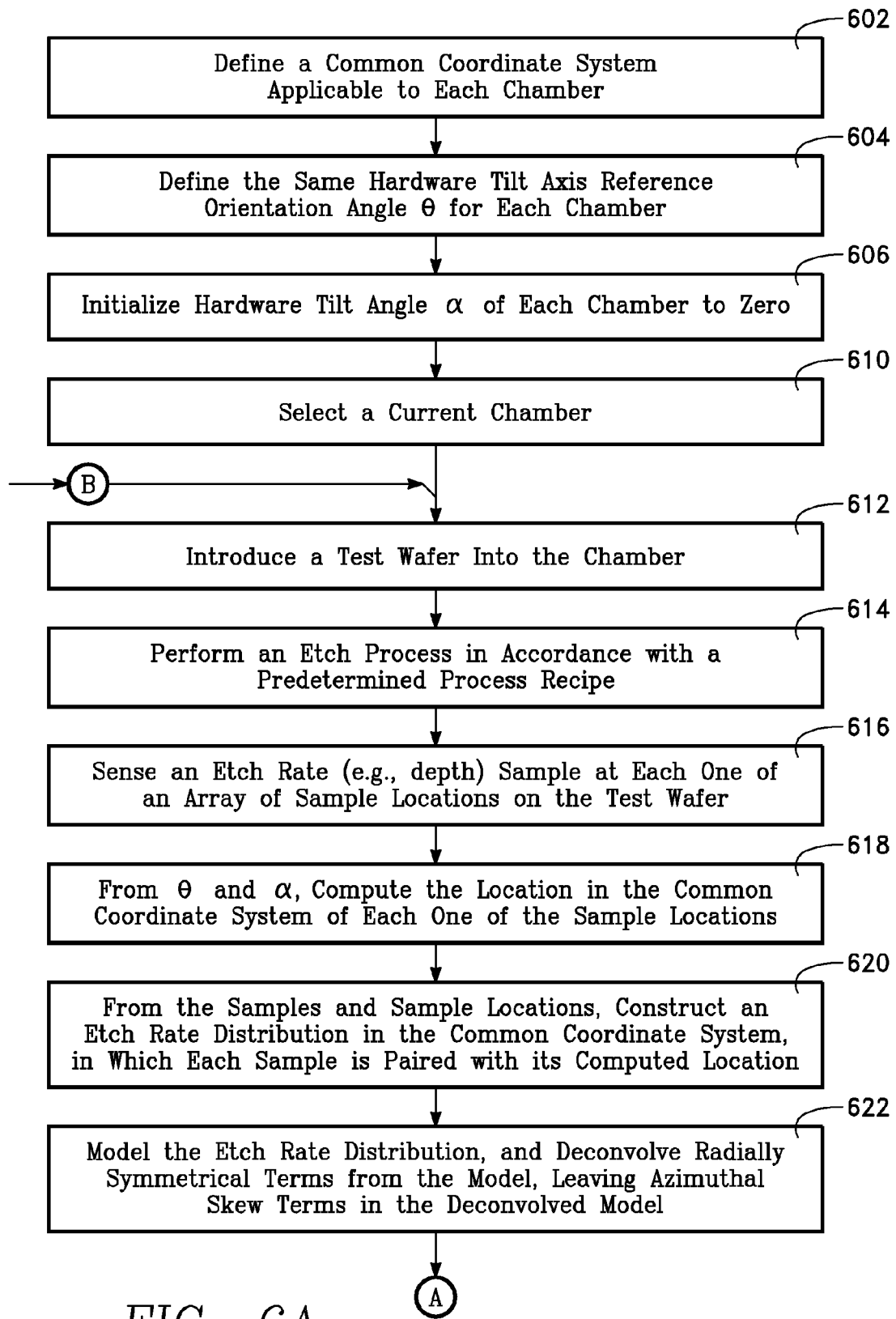
FIGS. 6A and 6B constitute a detailed flow diagram of the first embodiment.
Figure 6B:
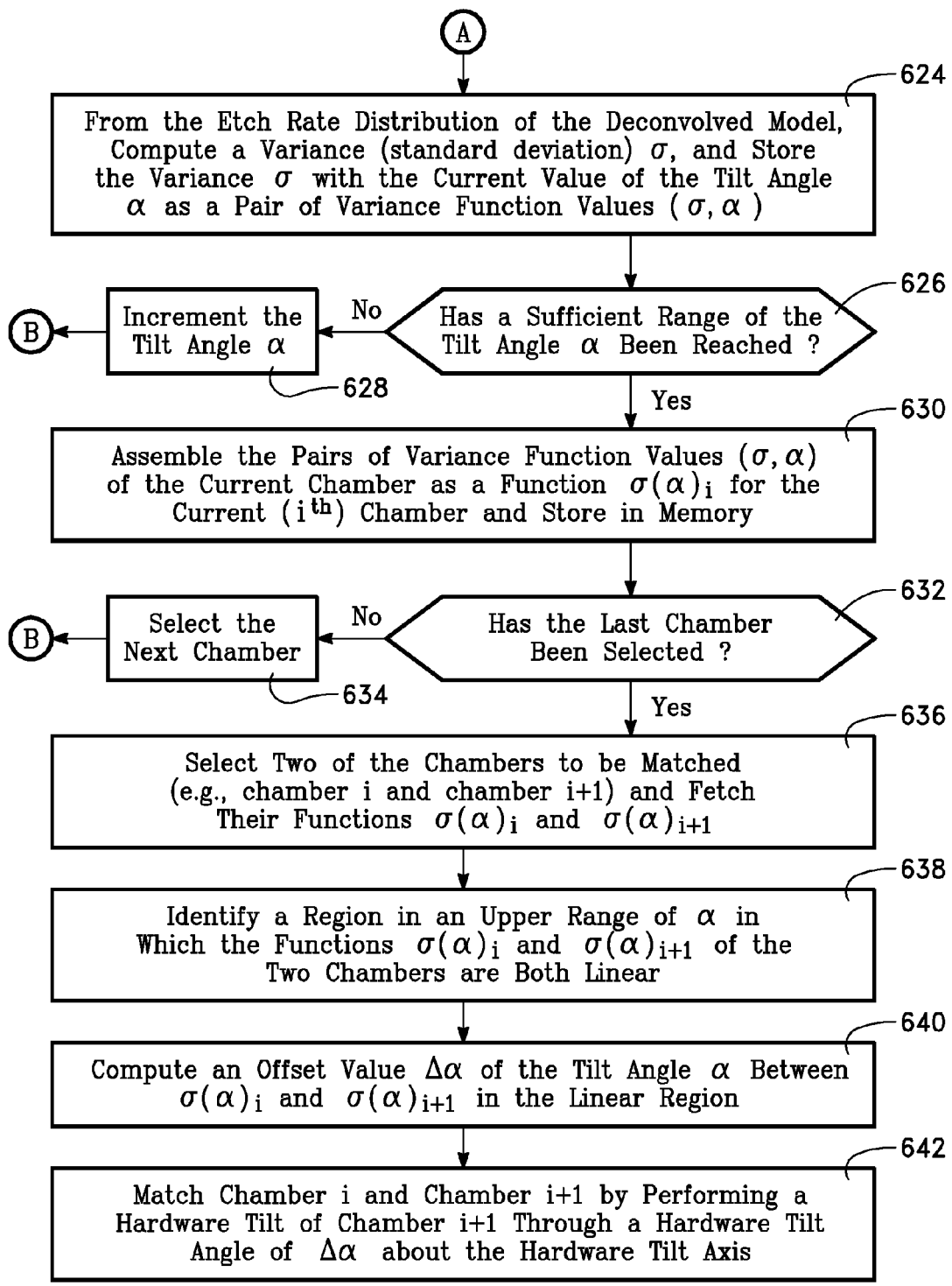

FIGS. 6A-6B constitute a detailed flow diagram of the empirical method briefly summarized in FIG. 5. The method of FIGS. 6A-6B begins by defining a common coordinate system applicable to each reactor (block 602 of FIG. 6). The same hardware tilt axis reference orientation angle $\theta$ is defined for each reactor (block 604). The hardware tilt angle $\alpha$ of each reactor is initialized to zero (block 606).

Figure 7:
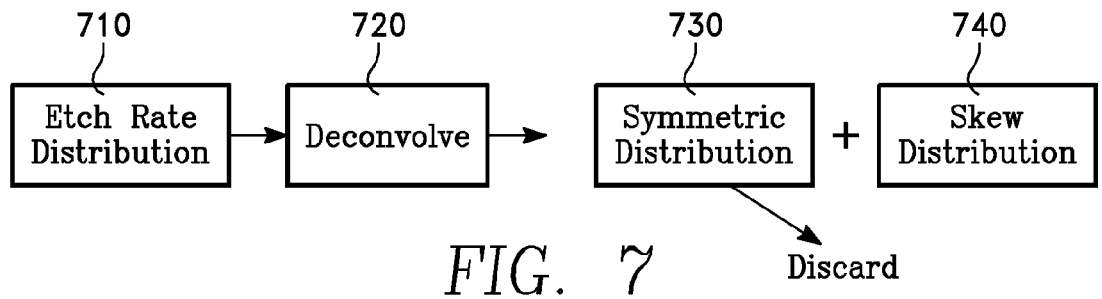
FIG. 7 is a flow diagram depicting a process for removing a radially symmetrical component from an etch rate distribution.

A current reactor is selected (block 610), a test wafer is introduced into the reactor (block 612) and an etch process is performed in accordance with a predetermined process recipe (block 614). The sensor 128 is used to sense an etch rate (e.g., depth) sample at each one of an array of sample locations on the test wafer (block 616). The computer 126 computes, from $\theta$ and $\alpha$, the location in the common coordinate system of each one of the sample locations (block 618). From this information, the computer 126 constructs an etch rate distribution in the common coordinate system, in which each sample is paired with its computed location (block 620). The computer 126 is used to model the etch rate distribution, and to deconvolve a radially symmetrical component from the model, leaving an azimuthal skew component in the deconvolved model (block 622). FIG. 7 is a simplified conceptual illustration depicting the deconvolution process, in which an etch rate distribution 710 consisting of both a radially symmetrical component and an azimuthal skew component, is modeled, for example as a six degree polynomial. In FIG. 7, a deconvolution operation 720 is performed by the computer 126, in which the radially symmetrical component 730 is removed from the etch rate distribution, leaving an azimuthal skew component 740. This deconvolution operation is performed in block 622 of FIG. 6. A noise component, not illustrated, may also remain, and should be negligible compared to the other components. (Optionally, such noise may be removed by mathematical techniques.)

The computer 126 computes the variance $\sigma$ of the deconvolved model of the etch rate distribution. The computer 126 stores the variance σ of the deconvolved model with the current value of the tilt angle α as a pair of variance function values (σ, α) in the memory 126-1 (block 624 of FIG. 6A). A determination is then made of whether the end of range of the tilt angle α been reached (block 626). If not (NO branch of block 626), the computer 126 commands the controller 124 to increment the tilt angle α by a small predetermined amount (block 628). The process then repeats the sequence of blocks 612 through 626. At block 626, if the end of range of the tilt angle α has been reached (YES branch of block 626), the computer 126 synthesizes a function σ(α)$_i$ for the current (i$^{th}$) reactor from the pairs of values (σ, α) obtained for the i$^{th}$ reactor (block 630). This function is then stored in the memory 126-1.

A determination is then made of whether the last reactor has been selected (block 632). If not (NO branch of block 632), the next reactor is selected (block 634) and the process repeats the sequence of blocks 612-632. If the last reactor was previously selected (YES branch of block 632), two of the reactors are selected to be matched (e.g., reactor i and reactor i+1) and the computer 126 fetches their functions σ(α)$_i$ and σ(α)$_{i+1}$ from the memory 126-1 (block 636 of FIG. 6B).

The computer 126 (or the user) identifies a linear region in an upper range of α in which the functions σ(α)$_i$ and σ(α)$_{i+1}$ of the two reactors are both linear (block 638). The linear region may correspond, in a particular example, to the region above α=0.15 in the graph of FIG. 4. The computer determines or computes an offset value Δα of the tilt angle α between σ(α)$_i$ and σ(α)$_{i+1}$ in the linear region (block 640). The two reactors, reactor i and reactor i+1, are matched by performing a hardware tilt of reactor i+1 through a hardware tilt angle of Δα about the hardware tilt axis (block 642) relative to an initial (e.g., zero) tilt angle.

Figure 8:
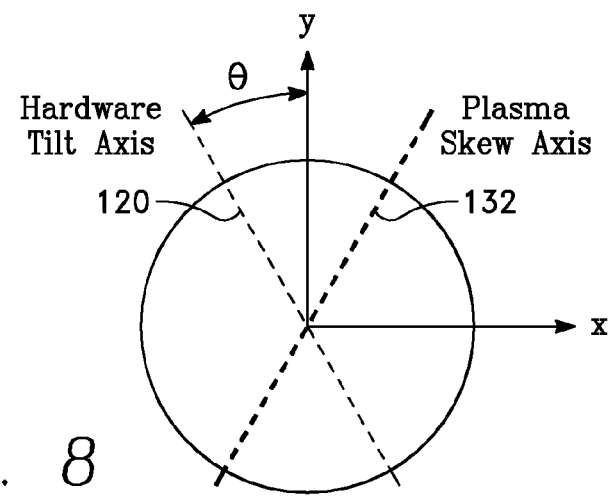
FIG. 8 is a graph depicting an example of the relative orientation of a plasma skew axis and a hardware tilt axis.

Predictive Method of Matching Reactors:

In a predictive method of matching two reactors, a first vector, VECTOR 1, is defined for each reactor having a magnitude equal to the variance of the etch rate distribution measured at an initial (e.g., zero) tilt angle. This first vector is further defined as having a direction orthogonal to the plasma skew axis (e.g., the plasma skew axis 132 of FIG. 8) observed in the etch rate distribution. As depicted in FIG. 8, the plasma skew axis 132 in the measured etch rate distribution typically can have a direction different from the hardware tilt axis 120.

Figure 9A:
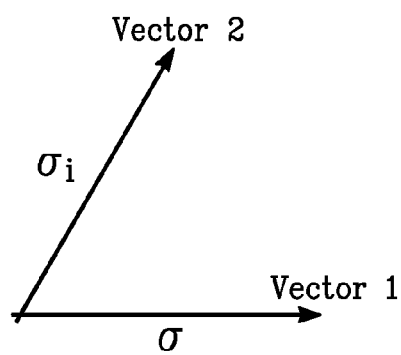
FIGS. 9A and 9B depict a plasma skew vector and a hardware tilt skew vector (FIG. 9A) and their addition (FIG. 9B).

For each reactor, a succession of second vectors are computed at successive hardware tilt angles in a predetermined range of hardware tilt angles. One example of a second vector, VECTOR 2, and the first vector, VECTOR 1, is depicted in FIG. 9A. The direction of the VECTOR 2 is orthogonal to the hardware tilt axis. The magnitude of each second vector is the variance σ computed from the current hardware tilt angle α. This computation is σ=M α, where M is the slope of the graph of FIG. 4.

Figure 9B:
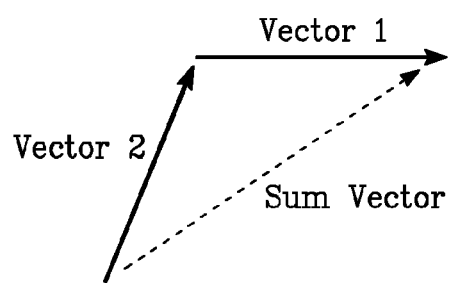

For each one of the succession of second vectors, a vector sum of VECTOR 1+VECTOR 2 is computed (FIG. 9B), and the magnitude σ$_{SUM}$ of the vector sum is stored with the corresponding tilt angle α as a value pair (σ$_{SUM}$, α). The succession of value pairs (σ$_{SUM}$, α) defines a function σ$_{SUM}$(α). As in the example of FIG. 4, the offset Δα between the functions σ$_{SUM}$(α)$_i$ and σ$_{SUM}$(α)$_{i+1}$ of two different reactors is determined, in the manner described above with reference to FIG. 4. The reactors are then matched by performing a hardware tilt through a tilt angle equal to the offset.

Figure 10:
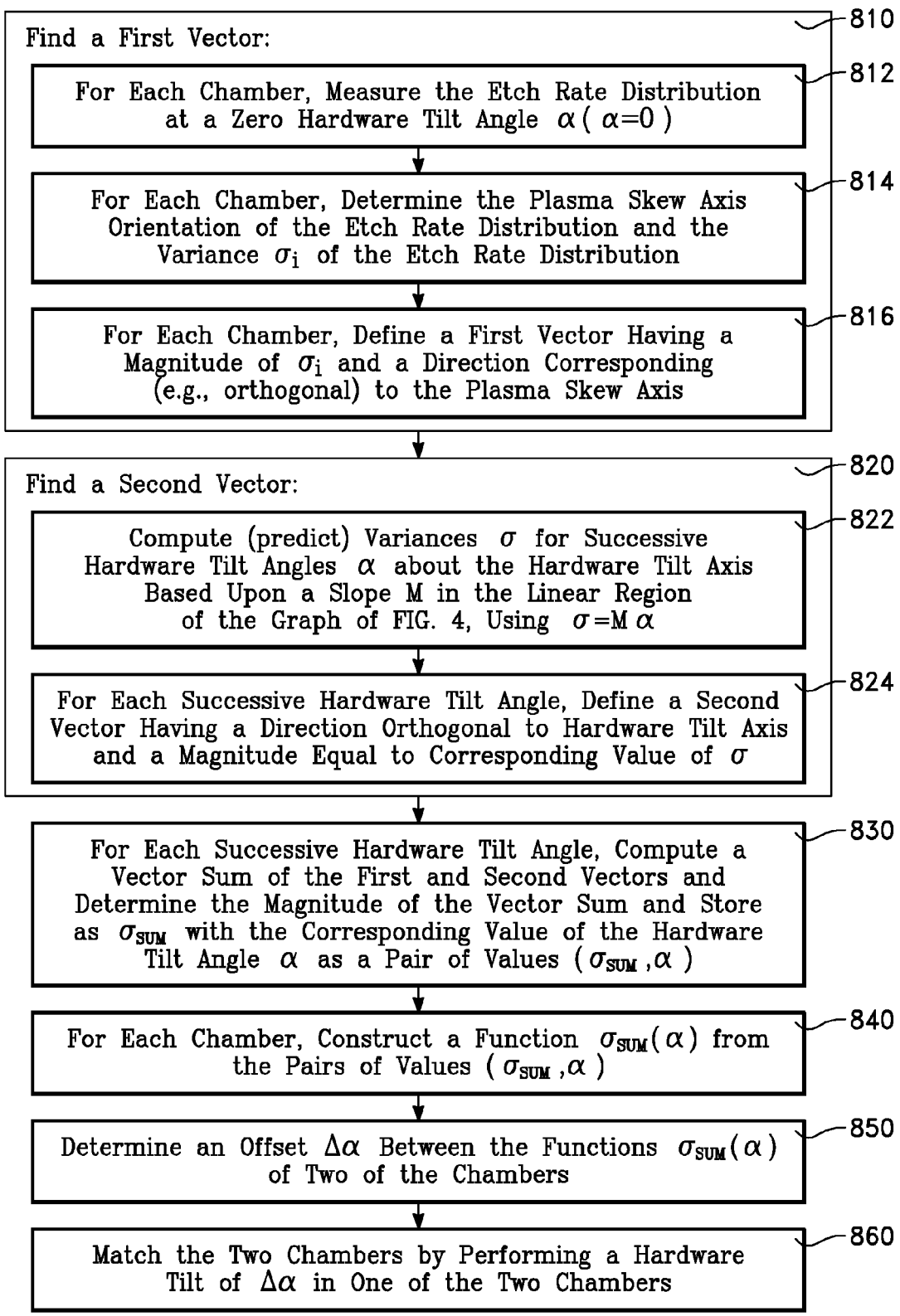
FIG. 10 is an abbreviated flow diagram providing a summary of a predictive method in accordance with a second embodiment.

FIG. 10 is an abbreviated overview of the predictive method of matching reactors. The method of FIG. 10 proceeds as follows: The first operation is to find a first vector representing plasma azimuthal skew non-uniformity in a reactor (block 810 of FIG. 10). This first operation is as follows: For each reactor, measure the etch rate distribution at a zero hardware tilt angle α (block 812 of FIG. 10). For each reactor, determine the direction of the plasma skew axis of the etch rate distribution and determine the variance σ$_i$ of the etch rate distribution (block 814). For each reactor, define the first vector as having a magnitude of σ$_i$ and a direction orthogonal to the plasma skew axis (block 816).

The second operation is to find a second vector for each one of successive hardware tilt angles (block 820). This second operation is as follows: For each reactor, compute (predict) variances σ for successive hardware tilt angles α about the hardware tilt axis oriented at θ (block 822). This prediction is based upon a slope M in the linear region of the graph of FIG. 4, using σ=M α. The slope M may be obtained as an average over a number of similar reactors for which data corresponding to the graph of FIG. 4 has been obtained. For each successive hardware tilt angle, define a second vector having a direction corresponding (e.g., orthogonal) to the direction of the hardware tilt axis and a magnitude equal to the corresponding value of σ (block 824).

After defining the first and second vectors, the predictive method continues as follows: For each successive hardware tilt angle α, compute a vector sum of the first and second vectors and determine the magnitude of the vector sum and store as σ$_{SUM}$ with the corresponding value of the hardware tilt angle α as a pair of values (σ$_{SUM}$, α) (block 830 of FIG. 10). For each reactor, the computer synthesizes a function σ$_{SUM}$(α) from the plural pairs of values [σ$_{SUM}$, α] (block 840 of FIG. 10).

The computer 126 (or a user) determines an offset Δα between the functions σ$_{SUM}$(α) of two of the reactors (block 850). The two reactors are matched by performing a hardware tilt of Δα in one of the two reactors (block 860) relative to the initial hardware tilt angle.

Figure 11A:
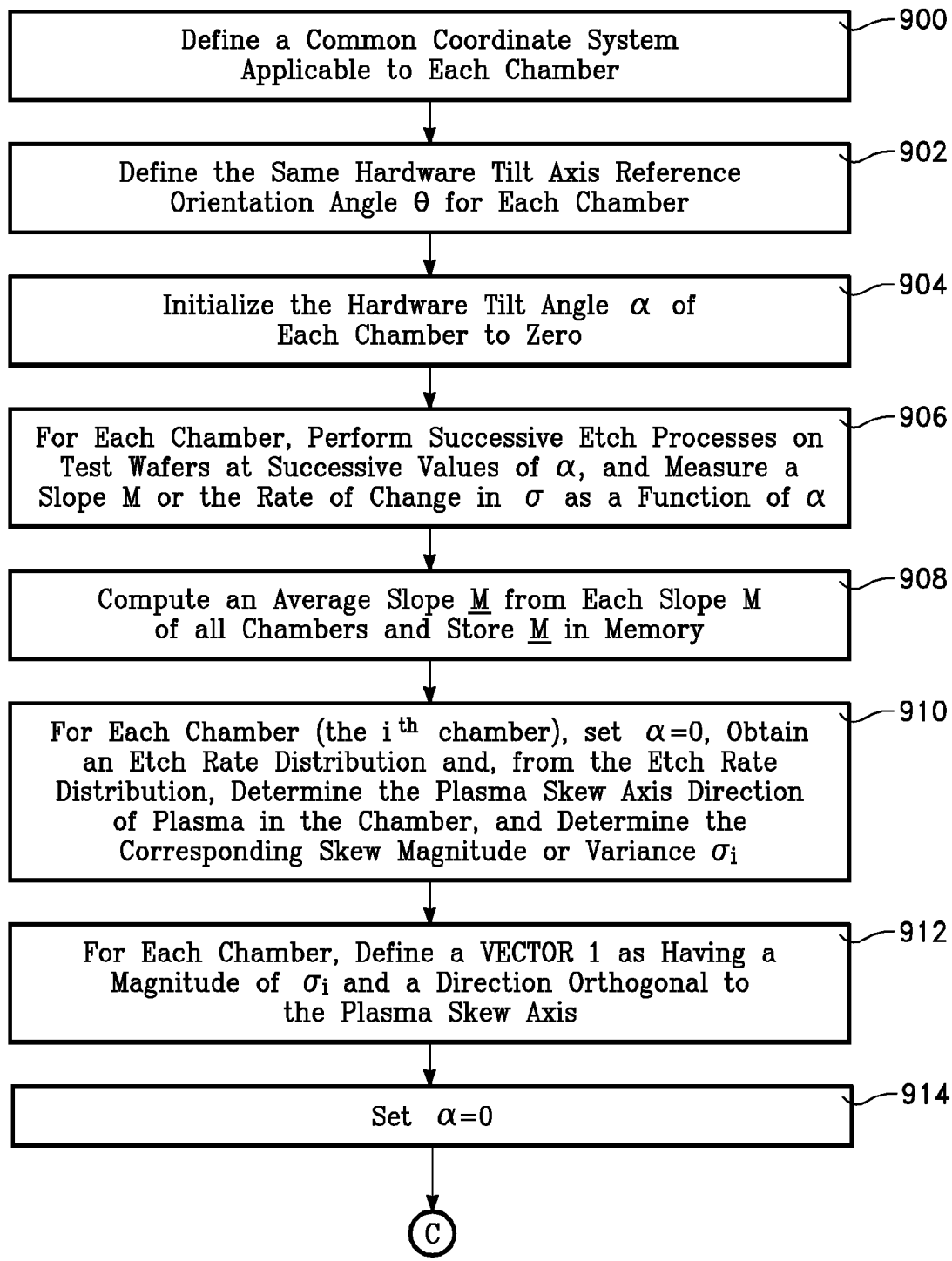
FIGS. 11A and 11B constitute a detailed flow diagram of the second embodiment.
Figure 11B:
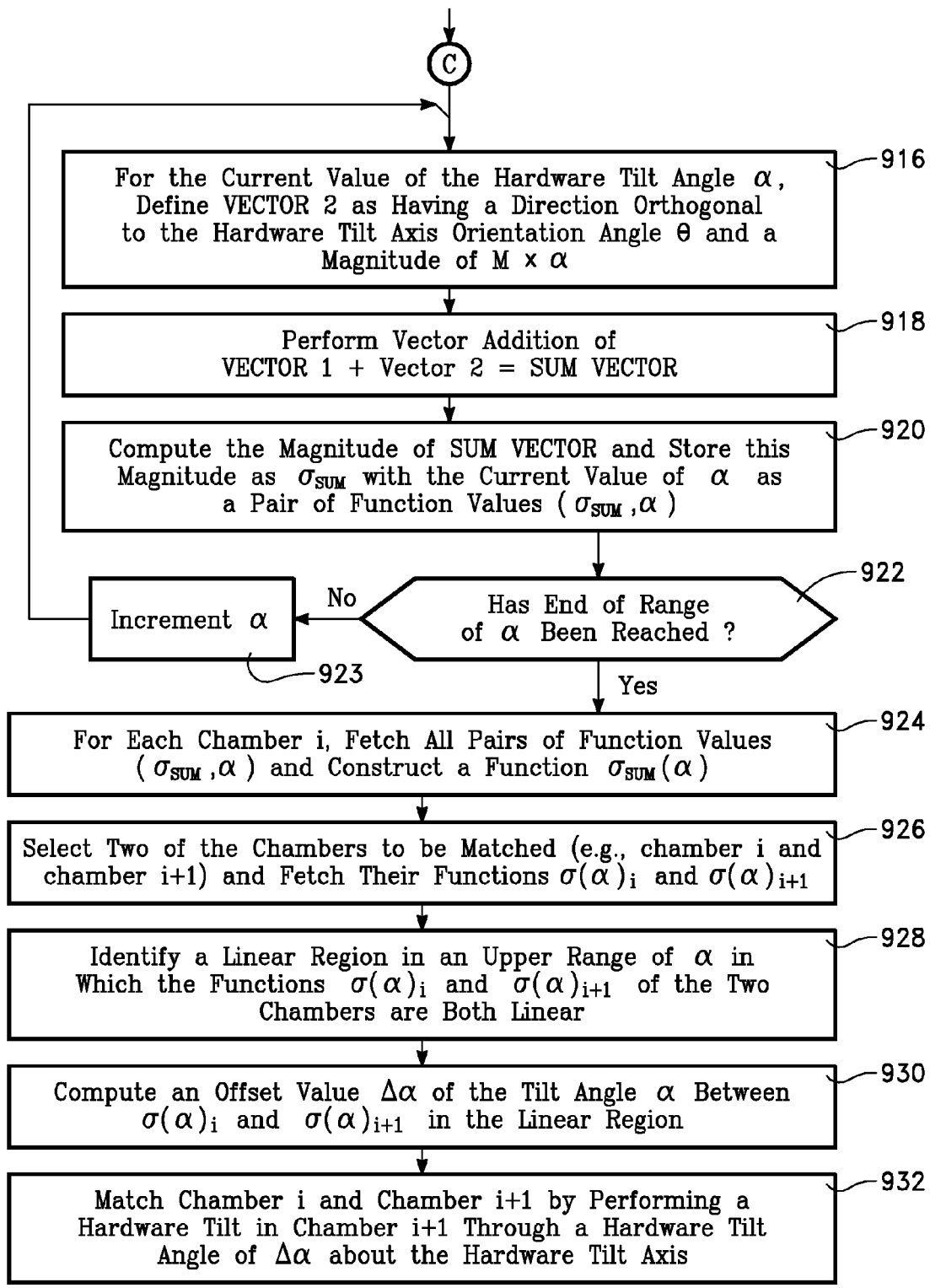

FIGS. 11A-11B constitute a detailed flow diagram of the predictive method summarized in FIG. 10. The method of FIGS. 11A-11B begins by defining a common coordinate system applicable to each reactor (block 900 of FIG. 11A), defining the same hardware tilt axis direction for each reactor (block 902), and initializing the hardware tilt angle α of each reactor to zero (block 904).

A rate of change of etch rate distribution variance σ with tilt angle α is obtained by the following operations: (a) for each reactor, perform successive etch processes on test wafers at successive values of α, and measure a slope M or the rate of change in σ as a function of α (block 906), and (b) compute an average slope $\underline{M}$ from each slope M of a set of reactors and store $\underline{M}$ in memory (block 908).

A first vector characterizing plasma azimuthal skew component of the reactor is obtained as follows: (a) for each reactor (the i$^{th}$ reactor), set α=0, obtain an etch rate distribution and, from the etch rate distribution, determine the direction of the plasma skew axis of plasma in the reactor, and determine the corresponding skew magnitude or variance σ$_i$ (block 910); and (b) for each reactor, define a VECTOR 1 as having a magnitude of σ$_i$ and a direction orthogonal to the direction of the plasma skew axis in the common coordinate system (block 912).

A second vector characterizing azimuthal skew component of non-uniformity due to hardware rotation is computed (predicted) for a succession of tilt angles as follows: (a) for each reactor, initialize α to 0 (block 914), (b) for the current value of the hardware tilt angle α, define a VECTOR 2 as having a direction orthogonal to the hardware tilt axis and a magnitude of $\underline{M}$·α (block 916).

The process now continues by performing a vector addition of VECTOR 1+VECTOR 2=SUM VECTOR (block 918), and computing the magnitude of SUM VECTOR and storing this magnitude as $\sigma_{SUM}$ with the current value of $\alpha$ as a pair of values ($\sigma_{SUM}$, $\alpha$) (block 920).

A determination is made of whether the end of range of $\alpha$ been reached (block 922). If not (NO branch of block 922), the value of $\alpha$ is incremented by a small predetermined amount (block 923) and the sequence of blocks 916-922 is repeated. If the end of range of $\alpha$ been reached (YES branch of block 922), then for each reactor i, the computer 126 fetches all pairs of function values ($\sigma_{SUM}$, $\alpha$) and synthesizes from them a function $\sigma_{SUM}(\alpha)_i$ (block 924).

A selection is made of two of the reactors to be matched (e.g., reactor i and reactor i+1) and the computer 126 fetches their functions $\sigma(\alpha)_i$ and $\sigma(\alpha)_{i+1}$ (block 926). A linear region is defined in an upper range of $\alpha$ in which the functions $\sigma(\alpha)_i$ and $\sigma(\alpha)_{i+1}$ of the two reactors are both linear (block 928). The functions $\sigma(\alpha)_i$ and $\sigma(\alpha)_{i+1}$ are compared to find an offset value $\Delta\alpha$ of the tilt angle $\alpha$ between $\sigma(\alpha)_i$ and $\sigma(\alpha)_{i+1}$ in the linear region (block 930). Matching of reactor i and reactor i+1 is accomplished by performing a hardware tilt of reactor i+1 through a hardware tilt angle of $\Delta\alpha$ about the hardware tilt axis (block 932).

While the foregoing is directed to embodiments of the present invention, other and further embodiments of the invention may be devised without departing from the basic scope thereof, and the scope thereof is determined by the claims that follow.

What is claimed is:

1. A method of matching two plasma reactors, comprising: for each one of said two plasma reactors:
    (a) introducing a workpiece into a chamber of the plasma reactor, performing an etch process on the workpiece and measuring etch rate distribution on the workpiece at an initial value of a tilt angle between a workpiece plane and a source power applicator about a tilt axis,
    (b) obtaining successive etch rate distributions relative to a workpiece plane at successive tilt angles $\alpha$ between the workpiece plane and said source power applicator, and determining successive variances $\sigma$ of said successive etch rate distributions,
    (c) generating a non-uniformity function $\sigma(\alpha)$ from said successive variances $\sigma$ and from corresponding ones of said successive tilt angles $\alpha$;
    determining an offset in tilt angle $\alpha$ between the non-uniformity functions $\sigma(\alpha)$ of said two plasma reactors; and
    changing the tilt angle $\alpha$ in one of said two plasma reactors by an amount corresponding to said offset in tilt angle.

2. The method of claim 1 wherein:
    said successive tilt angles begin at an initial tilt angle and define rotations about a predetermined tilt axis; and
    said changing the tilt angle comprises setting the tilt angle in said one plasma reactor to an angle exceeding said initial tilt angle by an amount equal to said offset in tilt angle.

3. The method of claim 2 wherein said initial tilt angle is zero.

4. The method of claim 3 wherein said initial tilt angle with reference to a coordinate system common to said two plasma reactors is the same for both of said two plasma reactors.

5. The method of claim 4 wherein an orientation of said predetermined tilt axis with respect to said common coordinate system is the same for said two plasma reactors.

6. The method of claim 1 wherein said determining successive variances of said successive etch rate distributions comprises:
    removing a radially symmetrical component from each of said etch rate distributions.

7. The method of claim 6 wherein said determining successive variances of said successive etch rate distributions comprises:
    computing a variance of each of said successive process rate distributions.

8. The method of claim 1 wherein each of said successive etch rate distributions is a distribution of depth measurements across a test workpiece.

9. The method of claim 1 wherein said obtaining successive etch rate distributions comprises, for each successive etch rate distribution:
    performing a plasma process on a test workpiece;
    measuring thin film depth or thin film thickness on the test workpiece at plural locations; and
    transforming said plural locations to a coordinate system common to said two plasma reactors.

10. The method of claim 9 wherein said performing a plasma process on the test workpiece is carried out using a common process recipe for said two plasma reactors.

11. The method of claim 1 wherein said determining an offset in tilt angle between the non-uniformity functions of said two plasma reactors comprises:
    defining a first axis for said successive variances and a second axis for said successive tilt angles;
    identifying a linear region along said second axis in which the non-uniformity functions $\sigma(\alpha)$ of said two plasma reactors are linear; and
    wherein said offset in tilt angle is a distance along said second axis between locations in said linear region at which said non-uniformity functions $\sigma(\alpha)$ of said two plasma reactors have the same variance along said first axis.

12. The method of claim 10 wherein said non-uniformity functions of said two plasma reactors have the same slope in said linear region.

13. The method of claim 1 further comprising selecting a third plasma reactor and matching said third plasma reactor to the other one of said two plasma reactors.

* * * * *